(12) United States Patent
Liu et al.

(10) Patent No.: US 8,137,463 B2
(45) Date of Patent: Mar. 20, 2012

(54) DUAL ZONE GAS INJECTION NOZZLE

(75) Inventors: Wei Liu, San Jose, CA (US); Johanes S. Swenberg, Los Gatos, CA (US); Hanh D. Nguyen, San Jose, CA (US); Son T. Nguyen, San Jose, CA (US); Roger Curtis, Stockton, CA (US); Philip A. Bottini, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 614 days.

(21) Appl. No.: 11/960,166

(22) Filed: Dec. 19, 2007

(65) Prior Publication Data

US 2009/0159424 A1    Jun. 25, 2009

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl. .............. 118/715; 156/345.29; 156/345.33; 156/345.34

(58) Field of Classification Search .................. 118/715; 156/345.29, 345.33, 345.34
See application file for complete search history.

(56) References Cited

U.S. PATENT DOCUMENTS

| | | | | |
|---|---|---|---|---|
| 1,968,348 A | * | 7/1934 | Placide | 239/590.5 |
| 3,352,492 A | * | 11/1967 | Cape | 239/85 |
| 3,592,575 A | * | 7/1971 | Jaeger et al. | 431/114 |
| 3,745,969 A | * | 7/1973 | Huffman et al. | 118/730 |
| 3,881,863 A | * | 5/1975 | Creuz | 432/222 |
| 3,995,811 A | * | 12/1976 | Broderick et al. | 239/85 |
| 4,069,974 A | * | 1/1978 | Zawacki | 239/706 |
| 4,080,927 A | * | 3/1978 | Brown | 118/716 |
| 4,293,755 A | * | 10/1981 | Hill et al. | 219/632 |
| 4,313,721 A | * | 2/1982 | Henriques | 431/265 |
| 4,389,229 A | * | 6/1983 | Jang et al. | 65/418 |

(Continued)

FOREIGN PATENT DOCUMENTS

JP    01-223724    9/1989

(Continued)

OTHER PUBLICATIONS

PCT International Search Report and Written Opinion dated May 29, 2009 for Application No. PCT/US2008/087139.

(Continued)

*Primary Examiner* — Rudy Zervigon
(74) *Attorney, Agent, or Firm* — Patterson & Sheridan, L.L.P.

(57) ABSTRACT

The present invention generally provides apparatus and method for processing a substrate. Particularly, the present invention provides apparatus and methods to obtain a desired distribution of a process gas. One embodiment of the present invention provides an apparatus for processing a substrate comprising an injection nozzle having a first fluid path including a first inlet configured to receive a fluid input, and a plurality of first injection ports connected with the first inlet, wherein the plurality of first injection ports are configured to direct a fluid from the first inlet towards a first region of a process volume, and a second fluid path including a second inlet configured to receive a fluid input, and a plurality of second injection ports connected with the second inlet, wherein the second injection ports are configured to direct a fluid from the second inlet towards a second region of the process volume.

8 Claims, 6 Drawing Sheets

U.S. PATENT DOCUMENTS

| | | | |
|---|---|---|---|
| 4,439,401 A * | 3/1984 | Voll et al. | 422/150 |
| 4,481,228 A * | 11/1984 | Morel | 427/481 |
| 4,512,841 A | 4/1985 | Cunningham, Jr. et al. | |
| 4,730,775 A * | 3/1988 | Maas | 239/120 |
| 4,854,263 A * | 8/1989 | Chang et al. | 118/715 |
| 5,002,928 A * | 3/1991 | Fukui et al. | 505/401 |
| 5,105,761 A * | 4/1992 | Charlet et al. | 118/723 ME |
| 5,110,407 A | 5/1992 | Ono et al. | |
| 5,134,965 A * | 8/1992 | Tokuda et al. | 118/723 MW |
| 5,169,509 A * | 12/1992 | Latz et al. | 204/298.03 |
| 5,232,164 A * | 8/1993 | Resch et al. | 239/434 |
| 5,290,993 A * | 3/1994 | Kaji et al. | 219/121.43 |
| 5,297,738 A * | 3/1994 | Lehr et al. | 239/708 |
| 5,453,124 A * | 9/1995 | Moslehi et al. | 118/715 |
| 5,500,256 A * | 3/1996 | Watabe | 427/579 |
| 5,522,934 A * | 6/1996 | Suzuki et al. | 118/723 AN |
| 5,547,714 A * | 8/1996 | Huck et al. | 427/523 |
| 5,556,521 A * | 9/1996 | Ghanbari | 204/192.32 |
| 5,567,267 A * | 10/1996 | Kazama et al. | 156/345.27 |
| 5,614,055 A * | 3/1997 | Fairbairn et al. | 156/345.33 |
| 5,643,394 A * | 7/1997 | Maydan et al. | 156/345.33 |
| 5,678,595 A * | 10/1997 | Iwabuchi | 137/341 |
| 5,728,223 A * | 3/1998 | Murakami et al. | 118/715 |
| 5,746,834 A * | 5/1998 | Hanley | 118/715 |
| 5,772,771 A * | 6/1998 | Li et al. | 118/723 I |
| 5,888,413 A | 3/1999 | Okumura et al. | |
| 5,975,013 A | 11/1999 | Holland et al. | |
| 6,013,155 A * | 1/2000 | McMillin et al. | 156/345.33 |
| 6,024,826 A * | 2/2000 | Collins et al. | 156/345.37 |
| 6,054,013 A | 4/2000 | Collins et al. | |
| 6,070,551 A * | 6/2000 | Li et al. | 118/723 I |
| 6,095,083 A | 8/2000 | Rice et al. | |
| 6,106,663 A * | 8/2000 | Kuthi et al. | 156/345.34 |
| 6,143,078 A * | 11/2000 | Ishikawa et al. | 118/715 |
| 6,229,264 B1 | 5/2001 | Ni et al. | |
| 6,270,862 B1 * | 8/2001 | McMillin et al. | 427/569 |
| 6,287,643 B1 * | 9/2001 | Powell et al. | 427/562 |
| 6,299,692 B1 * | 10/2001 | Ku et al. | 118/726 |
| 6,302,965 B1 * | 10/2001 | Umotoy et al. | 118/715 |
| 6,414,648 B1 | 7/2002 | Holland et al. | |
| 6,453,992 B1 * | 9/2002 | Kim | 165/206 |
| 6,905,969 B2 | 6/2005 | DeOrnellas et al. | |
| 6,916,398 B2 * | 7/2005 | Chen et al. | 156/345.33 |
| 7,504,041 B2 | 3/2009 | Chandrachood et al. | |
| 2002/0086106 A1 * | 7/2002 | Park et al. | 427/248.1 |
| 2002/0088545 A1 * | 7/2002 | Lee et al. | 156/345.33 |
| 2002/0129768 A1 * | 9/2002 | Carpenter et al. | 118/715 |
| 2002/0179247 A1 * | 12/2002 | Davis et al. | 156/345.33 |
| 2003/0000924 A1 * | 1/2003 | Strang | 216/86 |
| 2003/0044529 A1 | 3/2003 | Wu et al. | |
| 2003/0070620 A1 * | 4/2003 | Cooperberg et al. | 118/723 AN |
| 2003/0141178 A1 * | 7/2003 | Shan et al. | 204/157.15 |
| 2004/0083971 A1 | 5/2004 | Holland et al. | |
| 2004/0163764 A1 | 8/2004 | Collins et al. | |
| 2004/0168769 A1 | 9/2004 | Matsuoka et al. | |
| 2004/0242021 A1 | 12/2004 | Kraus et al. | |
| 2005/0092245 A1 * | 5/2005 | Moon et al. | 118/715 |
| 2006/0029747 A1 | 2/2006 | Cruse et al. | |
| 2006/0096540 A1 * | 5/2006 | Choi | 118/724 |
| 2006/0196420 A1 * | 9/2006 | Ushakov et al. | 118/715 |
| 2006/0196603 A1 * | 9/2006 | Lei et al. | 156/345.33 |
| 2006/0219361 A1 * | 10/2006 | Wang et al. | 156/345.33 |
| 2007/0187363 A1 | 8/2007 | Oka et al. | |
| 2007/0256784 A1 | 11/2007 | Chandrachood et al. | |
| 2007/0256787 A1 | 11/2007 | Chandrachood et al. | |
| 2007/0257008 A1 | 11/2007 | Chandrachood et al. | |
| 2007/0257009 A1 | 11/2007 | Chandrachood et al. | |
| 2008/0121177 A1 * | 5/2008 | Bang et al. | 118/723 I |
| 2008/0121178 A1 * | 5/2008 | Bang et al. | 118/723 I |
| 2009/0042407 A1 * | 2/2009 | Bang et al. | 438/787 |

FOREIGN PATENT DOCUMENTS

KR   10-2006-0044039   5/2006

OTHER PUBLICATIONS

PCT International Search Report and Written Opinion dated Jul. 31, 2009 for International Application No. PCT/US2008/087134.

* cited by examiner

DUAL ZONE GAS INJECTION NOZZLE

BACKGROUND OF THE INVENTION

1. Field of the Invention

Embodiments of the present invention generally relate to method and apparatus for processing a semiconductor substrate. More particularly, embodiments of the present invention provide method and apparatus for processing a semiconductor substrate using inductively coupled plasma technology with improved uniformity.

2. Description of the Related Art

Plasma reactors used to fabricate semiconductor microelectronic circuits can employ RF (radio frequency) inductively coupled fields to maintain a plasma formed from a processing gas. Conventional inductively coupled plasma reactors generally includes a vacuum chamber having a side wall and a ceiling, a workpiece support pedestal within the chamber and generally facing the ceiling, a gas inlet capable of supplying a process gas into the chamber, and one or more coil antennas overlying the ceiling. The one or more coil antennas are generally wound about an axis of symmetry generally perpendicular to the ceiling. A RF plasma source power supply is connected across each of the coil antennas. Sometimes, the reactor may include an inner coil antenna overlying the ceiling and surrounded by an outer coil antenna.

Typically, a high frequency RF source power signal is applied to the one or more coil antennas near the reactor chamber ceiling. A substrate disposed on a pedestal within the chamber has a bias RF signal applied to it. The power of the signal applied to the coil antenna primarily determines the plasma ion density within the chamber, while the power of the bias signal applied to the substrate determines the ion energy at the wafer surface.

Typically with "inner" and "outer" coil antennas, the coils are distributed radially or horizontally (rather than being confined to a discrete radius) so that their radial location is diffused accordingly. The radial distribution of plasma ion distribution is changed by changing the relative apportionment of applied RF power between the inner and outer antennas. However, it becomes more difficult to maintain a uniform plasma ion density across the entire wafer surface as wafers become larger and device feature become smaller.

FIG. 1 schematically illustrates a non-uniformity problem encountered by typical inductively coupled plasma reactors. FIG. 1 is a result showing nitrogen dosages across a substrate after nitridation processes preformed in a typical inductively coupled plasma reactor. The nitridation processes is performed to silicon dioxide gate dielectric film formed on a substrate. The substrate is positioned in a vacuum chamber capable of generating inductively coupled plasma. Nitrogen gas is flown to the plasma chamber and a plasma is struck while the flow continues. The nitrogen radicals and/or nitrogen ions in the nitrogen plasma then diffuse and/or bombard into the silicon dioxide gate dielectric film.

FIG. 1 is a diameter scan chart showing nitrogen dosage (Ndose) along a diameter of a 300 mm substrate after nitridation performed in an inductively coupled plasma reactor. The diameter scan chart of FIG. 1 has an "M" shape illustrating a low dosage near the center of the substrate. The center drop of the M shape is mainly affected by the gas supply near the center region.

Therefore, there is a need for apparatus and method for processing a semiconductor substrate using inductively coupled plasma technology with improved uniformity.

SUMMARY OF THE INVENTION

The present invention generally provides apparatus and method for processing a substrate. Particularly, the present invention provides apparatus and methods to obtain a desired distribution of a process gas in inductive plasma reactor.

One embodiment of the present invention provides an apparatus for processing a substrate comprising a chamber body defining a process volume, and an injection nozzle assembly at least partially disposed in the process volume, the injection nozzle assembly having a first fluid path including a first inlet configured to receive a fluid input, and a plurality of first injection ports connected with the first inlet, wherein the plurality of first injection ports are configured to direct a fluid from the first inlet towards a first region of the process volume, and a second fluid path including a second inlet configured to receive a fluid input, and a plurality of second injection ports connected with the second inlet, wherein the second injection ports are configured to direct a fluid from the second inlet towards a second region of the process volume.

Another embodiment of the present invention provides an apparatus for processing a substrate comprising a chamber body defining a process volume, a substrate pedestal disposed in the process volume, and a gas supply assembly in fluid communication with the process volume, wherein the gas supply assembly comprises a nozzle disposed substantially above a center of the substrate pedestal, wherein the nozzle has a plurality of first injection ports configured to direct a processing gas to a central region on above the substrate pedestal, and a plurality of second injection ports configured to direct the processing gas to an edge region above the substrate pedestal, and a flow control unit configured to adjust a ratio of the processing gas flown to the plurality of first injection ports and the processing gas flown to the plurality of second injection ports.

Yet another embodiment of the present invention provides a method for processing a substrate comprising providing a process chamber defining a process volume, positioning the substrate in the process volume, and flowing a processing gas to the process volume through an injection assembly, wherein flowing the processing gas comprises flowing a first portion of the processing gas to a first region of the process volume through a plurality of first injection ports, flowing a second portion of the processing gas to a second region of the process volume through a plurality of second injection ports, and adjusting a ratio of the first portion and second portion to achieve a desired distribution of the processing gas within the process volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides apparatus and methods for processing a semiconductor substrate using inductively coupled plasma. Embodiments of the present invention provide inductively coupled plasma reactors having features that provide improved uniformity. Particularly, the inductively coupled plasma reactors of the present invention comprises an gas supply assembly having independently adjustable gas injection ports.

Figure 1:
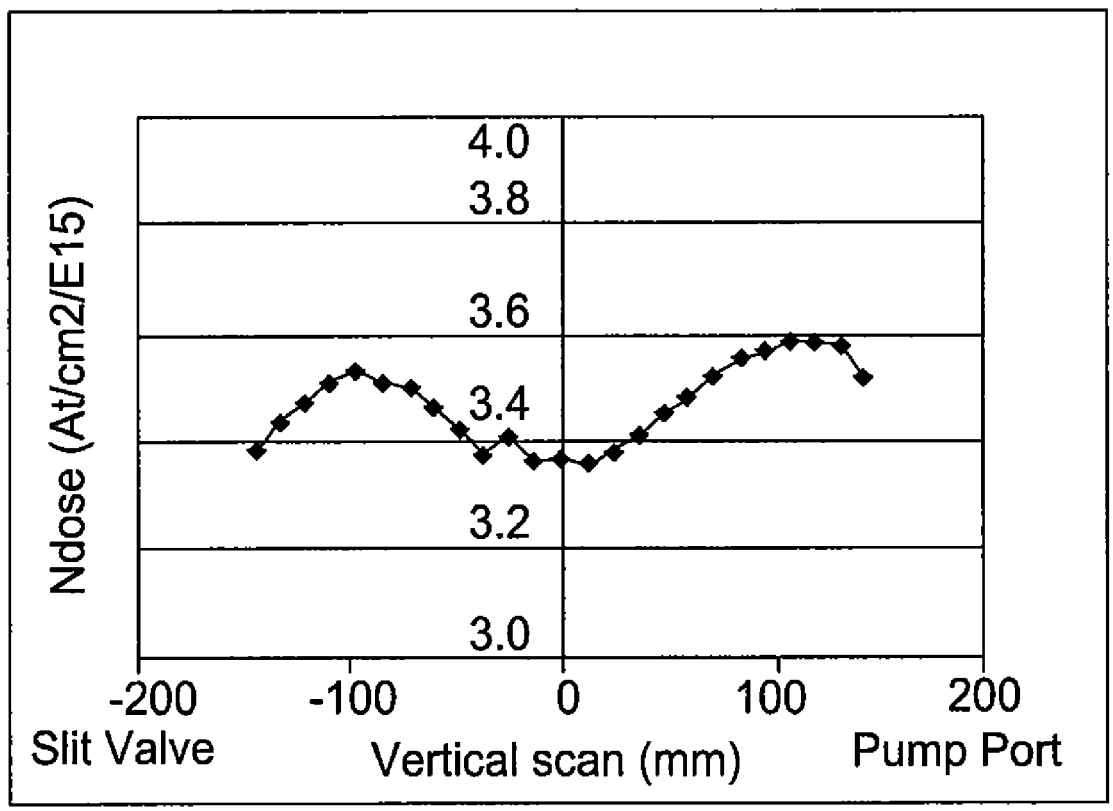
FIG. 1 (prior art) schematically illustrates a non-uniformity problem encountered by typical inductively coupled plasma reactors.
Figure 2:
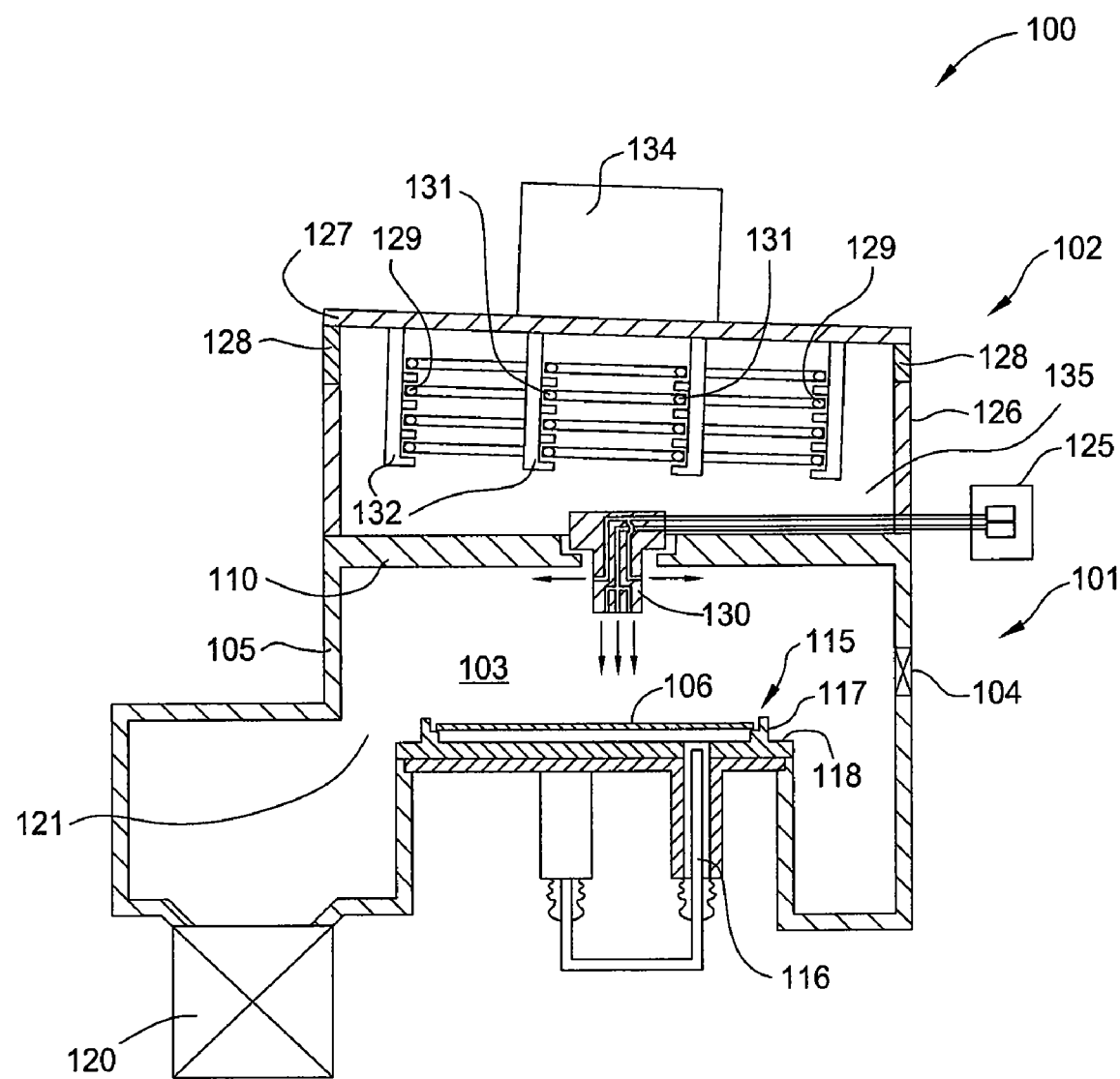
FIG. 2 schematically illustrates a sectional side view of a plasma reactor in accordance with one embodiment of the present invention.

FIG. 2 schematically illustrates a sectional side view of a plasma reactor 100 in accordance with one embodiment of the present invention. The plasma reactor 100 generally comprises a reactor chamber 101 and an antenna assembly 102 positioned above the reactor chamber 101. The antenna assembly 102 is configured to generate inductively coupled plasma in the reactor chamber 101.

The reactor chamber 101 has a process volume 103 defined by a cylindrical side wall 105 and a flat ceiling 110. A substrate support pedestal 115 is disposed within the reactor chamber 101, oriented in facing relationship to the flat ceiling 110 and centered on the chamber axis of symmetry. The substrate support pedestal 115 is configured to support a substrate 106 thereon. The substrate support pedestal 115 comprises a supporting body 117 configured to receive and support the substrate 106 during process. In one embodiment, the substrate support pedestal 115 has an edge surface 118 circumscribing the substrate 106. The relative height between the edge surface 118 and the substrate 106 is configured to adjust processing results near the edge of the substrate 106.

A plurality of supporting pins 116 are movably disposed on the substrate support pedestal 115 and are configured to facilitate substrate transporting. A vacuum pump 120 cooperates with a vacuum port 121 of the reactor chamber 101. A slit valve port 104 is formed on the cylindrical side wall 105 allowing transporting of substrates in and out of the process volume 103.

A process gas supply 125 furnishes process gas into the process volume 103 through a gas inlet 130. The gas inlet 130 may be centered on the flat ceiling 110 and has a plurality of gas injection ports directing gas to different regions of the process volume 103. In one embodiment, the gas inlet 130 may be configured to supply individually adjustable flow of process gas to different regions of the process volume 103 to achieve desired distribution of process gas within the process volume 103.

The antenna assembly 102 comprises a cylindrical side wall 126 disposed on the flat ceiling 110 of the reactor chamber. A coil mounting plate 127 is movably disposed on the side wall 126. The side wall 126, the coil mounting plate 127, and the flat ceiling 110 generally define a coil volume 135. A plurality of coil hangers 132 extend from the coil mounting plate 127 in the coil volume 135. The plurality of coil hangers 132 are configured to position one or more coil antennas in the coil volume 135.

In one embodiment, an inner coil 131 and an outer coil 129 are arranged in the coil volume 135 to maintain a uniform plasma ion density across the entire substrate surface during process. In one embodiment, the inner coil 131 has a diameter of about 5 inches and the outer coil 129 has a diameter of about 20 inches. Detailed description of different designs of coil antennas may be found in U.S. Pat. No. 6,685,798, entitled "Plasma Reactor Having a Symmetric Parallel Conductor Coil Antenna", which is incorporated herein by reference.

Each of the inner coil 131 and the outer coil 129 may be a solenoidal multi-conductor interleaved coil antenna that defines a vertical right circular cylinder or imaginary cylindrical surface or locus whose axis of symmetry substantially coincides with that of the reactor chamber 101. It is desirable to have axis of the inner coil 131 and outer coil 129 to coincide with the axis of the axis of symmetry of the substrate 106 to be processed in the reactor chamber 101. However, the alignment among the inner coil 131, the outer coil 129, the reactor chamber 101, and the substrate 106 is susceptible to errors causing skews. The coil mounting plate 127 is movably positioned on the side walls 126 so that the inner coil 131 and the outer coil 129 may be tilted relative to the reactor chamber 101, together or independently. In one embodiment, the coil mounting plate 127 may be adjusted rotating a tilt ring 128 positioned between the coil mounting plate 127 and the side wall 126. The tilt ring 128 has a variable thickness which enables a tilted mounting of the coil mounting plate 127.

The plasma reactor 100 further comprises a power assembly 134 configured to provide power supply to the inner coil 131 and the outer coil 129. The power assembly 134 generally comprises RF power supplies and matching networks. In one embodiment, the power assembly 134 may be positioned above the coil mounting plate 127.

More detailed description of the plasma reactor 100 may be found in U.S. patent application Ser. No. 11/960,111, filed Dec. 19, 2007, entitled "Apparatus and Method for Processing a Substrate Using Inductively Coupled Plasma Technology", which is incorporated herein by reference.

Figure 3:
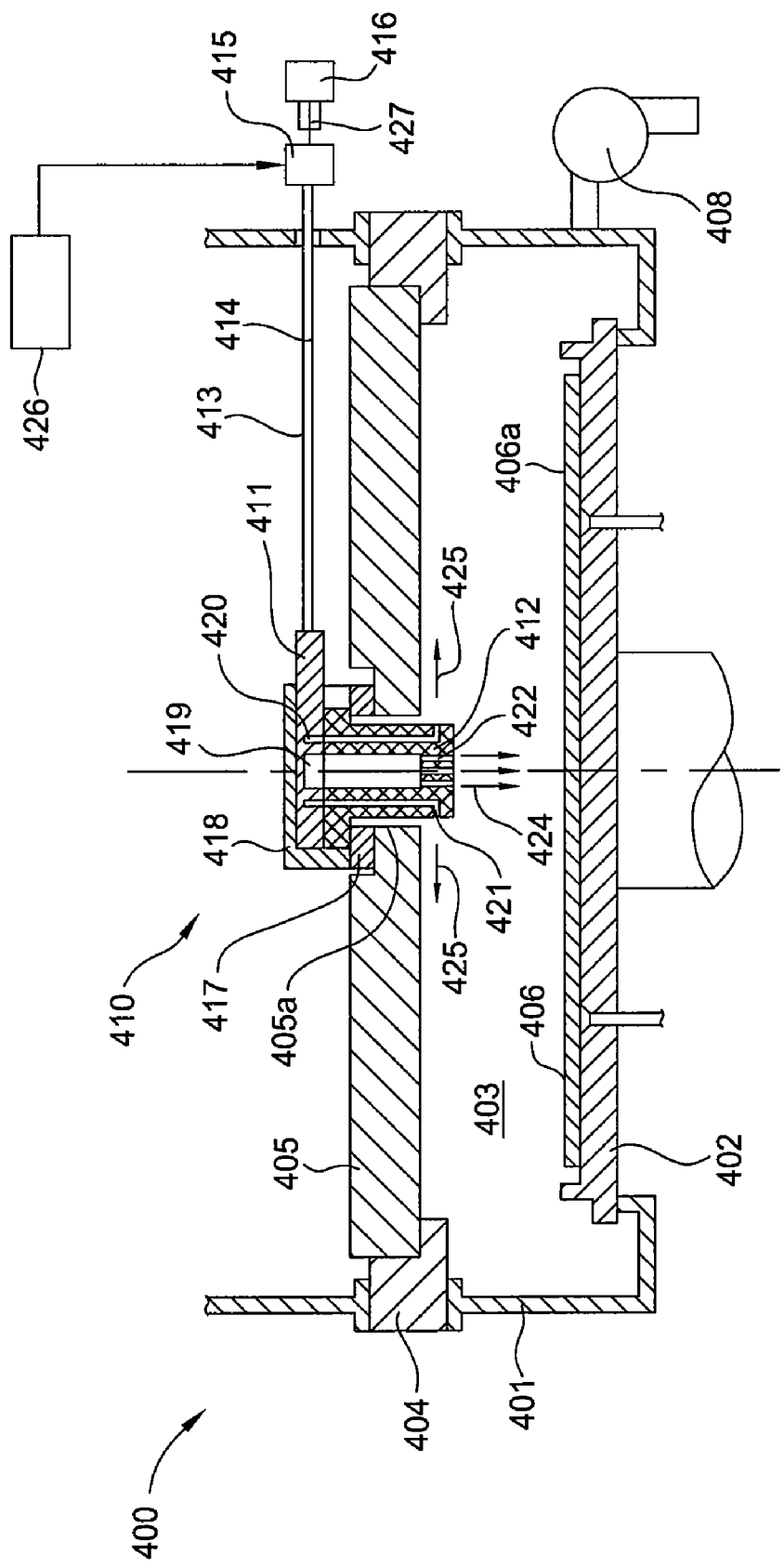
FIG. 3 schematically illustrates a partial sectional side view of a plasma reactor having an injection assembly in accordance with one embodiment of the present invention.

FIG. 3 schematically illustrates a partial sectional side view of a plasma reactor 400 having an injection assembly in accordance with one embodiment of the present invention.

The plasma reactor 400 may be similar to the plasma reactor 100 of FIG. 2. The plasma reactor 400 has a process volume 403 defined by a sidewall 401, a supporting pedestal 402, and a lid 405. In one embodiment, a supporting ring 404 may be coupled between the sidewall 401 and the lid 405. In one embodiment, the process volume 403 may be substantially cylindrical and configured to process circular substrates therein.

A gas supply assembly 410 is in fluid communication with the process volume 403 and is at least partially disposed in the process volume 403. The gas supply assembly is configured to supply a processing gas from a gas source 416 to the process volume 403. During process, a substrate 406 is disposed on the supporting pedestal 402 and exposing a top surface 406a to the processing gas in process volume 403. The gas supply assembly 410 is configured to supply the processing gas to the process volume 403 in a desired distribution, for example, a uniform distribution. In one embodiment, the gas supply assembly 410 is configured to achieve a desired distribution by injecting a process gas to at least two process zones, and adjusting ratio of flow rates among different process zones.

The gas supply assembly 410 comprises a nozzle 412 having a cylindrical shape. The nozzle 412 is partially disposed in the process volume 403 through an aperture 405a formed near a center of the lid 405. the nozzle 412 may have a The nozzle 412 may have a plurality of injection ports configured to directing gas flow toward different regions of the process volume 403.

The nozzle 412 has a plurality of central injection ports 422 configured to direct the process gas toward a central region of the process volume 403. In one embodiment, the plurality of central injection ports 422 are channels with openings perpendicular to the substrate 406 and are configured to inject a flow along directions shown by arrows 424.

The nozzle 412 has a plurality of outer injection ports 421 configured to direct the process gas toward an outer region of the process volume 403. In one embodiment, the plurality of outer injection ports 421 are channels with openings parallel to the substrate 406 around the perimeter of the nozzle 412 and are configured to inject a flow along directions shown by arrows 425.

The gas supply assembly 410 further comprises a feed plate 411 coupled to the nozzle 412. The feed plate 411 is configured to receive two or more input flows and direct the input flows to the nozzle 412.

Figure 4A:
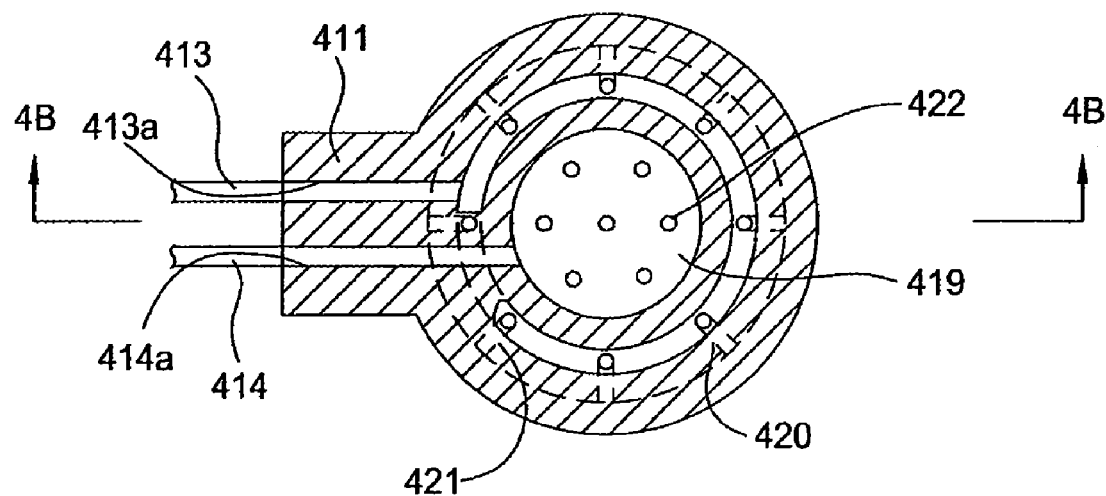
FIG. 4A schematically illustrates a sectional top view of a nozzle in accordance with one embodiment of the present invention.
Figure 4B:
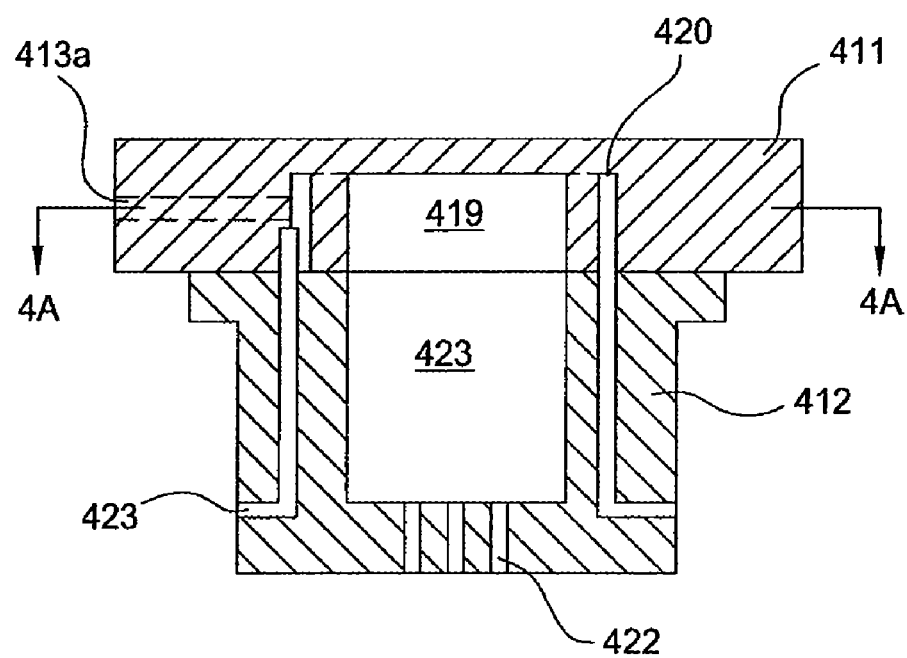
FIG. 4B schematically illustrates a sectional side view of the nozzle of FIG. 4A.

FIGS. 4A-4B schematically illustrate sectional views of the nozzle 412 and the feed plate 411. Referring to FIG. 4A, the feed plate 411 has two receiving channels 413a, 414a configured to connect to input flow. The receiving channel 414a opens to an inner passage 419, which is a recess formed near a center of the feed plate 411. The receiving channel 413a opens to an outer passage 420. The outer passage 420 is a circular recess surrounding the inner passage 419.

Referring to FIG. 4B, when the feed plate 411 is coupled to the nozzle 412, the inner passage 419 is in fluid communication with a central recess 423 of the nozzle 412. The central recess 423 is connected to the plurality of central injection ports 422. Therefore, the feed plate 411 and the nozzle 412 form a passage that delivers fluid coming from the receiving channel 413a to a central region of the process volume 403.

Similarly, the outer passage 420 is in fluid communication the plurality of outer injection ports 421. Therefore, the feed plate 411 and the nozzle 412 form a passage that delivers fluid coming from the receiving channel 414a to an outer region of the process volume 403.

In one embodiment, there are eight outer injection ports 421 evenly distributed around the nozzle 412 and seven central injection ports 422 formed on a bottom of the nozzle 412. However, other configurations of the injection ports are contemplated depending on process requirement.

The nozzle 412 and feed plate 411 may be fabricated from material suitable for chemistry and temperature requirement of processes performed in the plasma reactor 400. In one embodiment, the nozzle 412 may be fabricated from quartz. The lid 405 may also be fabricated from quartz. In one embodiment, the feed plate 411 may be fabricated from ceramic.

Referring back to FIG. 3, the nozzle 412 and the feed plate 411 may be secured together by an upper clamp 418 and a lower clamp 417.

The gas supply assembly 410 further comprises a flow control unit 415. The flow control unit 415 may have an input line 427 connected to the gas source 416, and two output lines 413, 414 connected to the feed plate 411. The flow control unit 415 may comprise an adjustable splitter configured to split an incoming flow from the input line 427 to the outputs 413, 414 at a variable ratio. The flow control unit 415 may be also control the total flow rate flown to the process volume 403. In one embodiment, the flow control unit 415 may split the incoming flow according to a control signal from a system controller 426 and may adjust a total flow rate according to control signals from the system controller 426.

During processing, the gas source 416 provides a process gas to the input line 427 of the flow control unit 415. The flow control unit 415 then directs the incoming gas to either one or both of the output lines 413, 414 according to the process requirements, for example in the form of control signals from the system controller 426. The process gas from the output lines 413, 414 then enter to passages formed in the feed plate 411 and the nozzle 412. The process gas is then injected by the nozzle 412 to different regions of the process volume 403 and to come in contact with the substrate 406. Typically, the process gas flows from the center of the process volume 403 where the nozzle 412 is disposed to an edge of the process volume 403 and exists the process volume 403 with assistance from a pumping system 408.

The distribution of the process gas in the process volume 403, thus, degrees of exposure of surface areas of the substrate 406 may be controlled using the gas supply assembly 410. At least three methods may be used individually or combined to achieve a desired gas distribution. First, direction, number, and dimension of the injection ports of the nozzle 412 may be adjusted to direct the process gas towards different regions of the process volume 403. Second, a ratio of the flow rates among different regions may be adjusted to achieve a desired distribution. Third, a total flow rate may be adjusted to achieve a desired distribution.

Figure 5B:
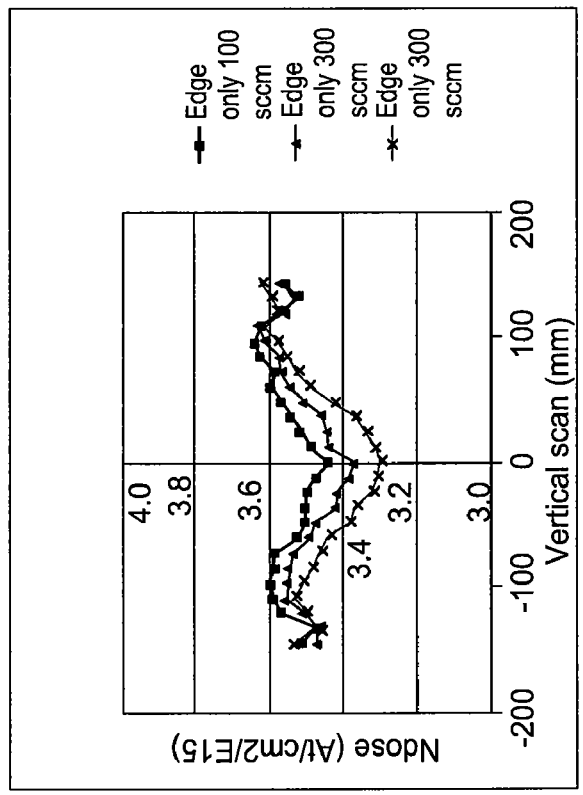
FIGS. 5A-5C are charts showing results of a nitridation process using a plasma reactor having an injection assembly in accordance with one embodiment of the present invention.
Figure 5A:
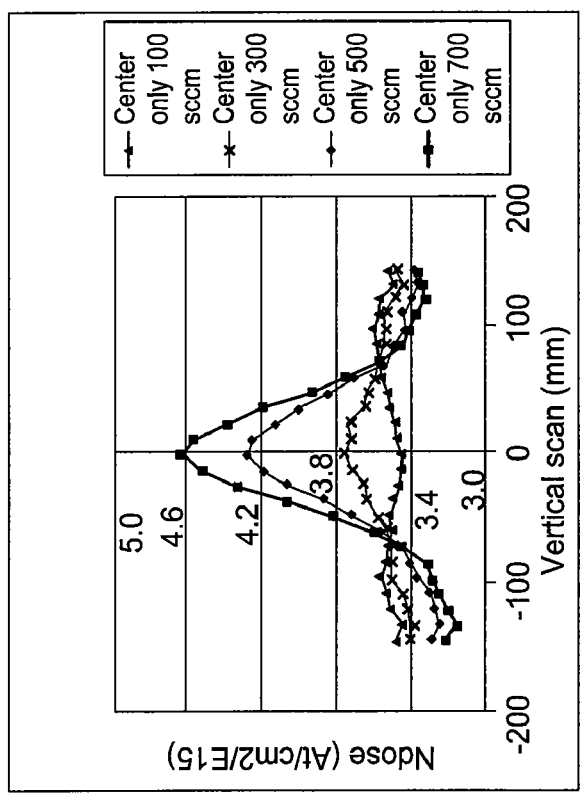
Figure 5C:
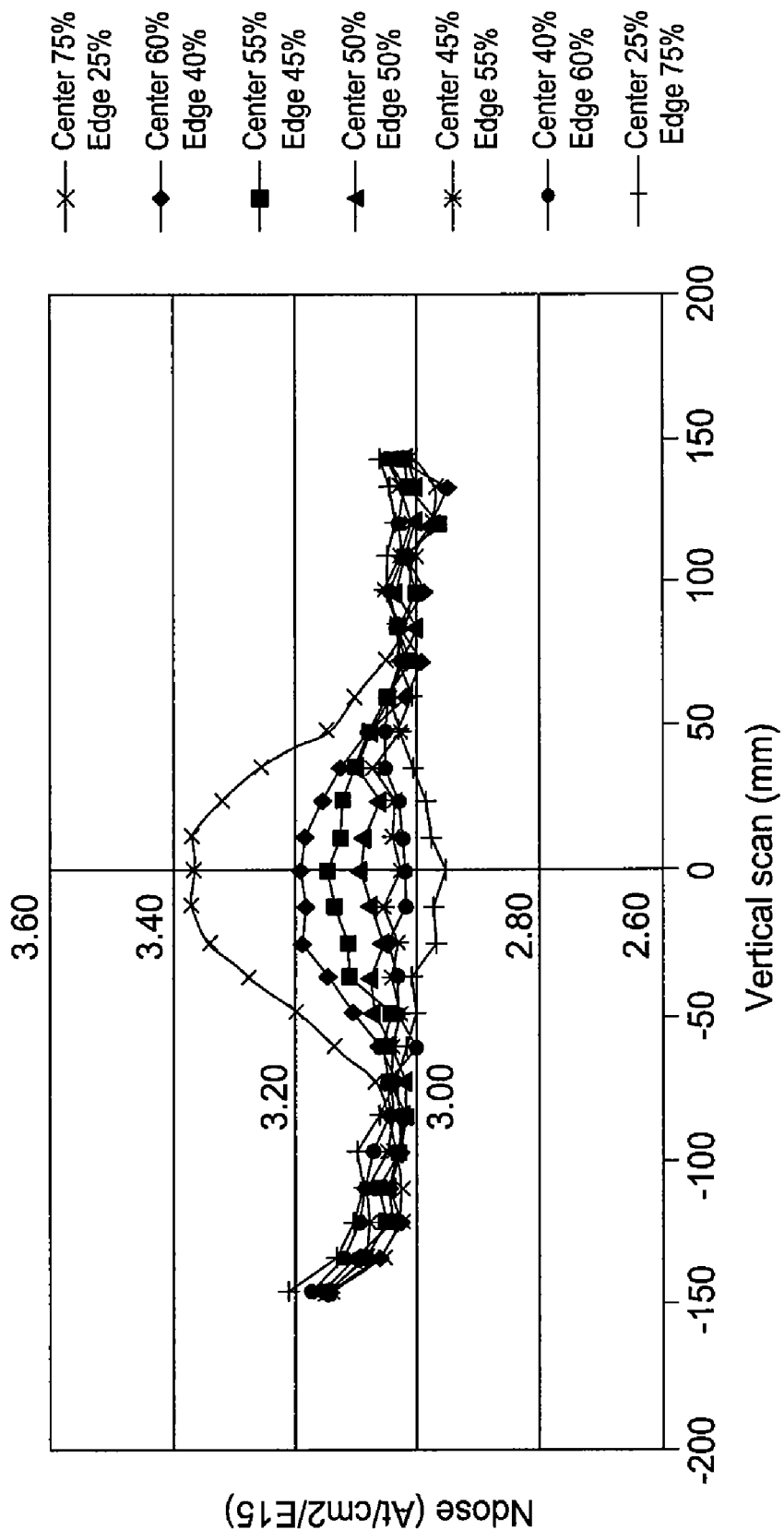

FIGS. 5A-5C are charts showing results of a nitridation process using a plasma reactor having an injection assembly in accordance with one embodiment of the present invention. The results in FIGS. 5A-5C demonstrate different gas distribution in a process chamber during a nitridation process as a result of flow adjustments using a gas supply assembly similar to the gas supply assembly 410 of FIG. 3.

The nitridation process is generally performed to silicon dioxide gate dielectric film formed on a substrate. The substrate is positioned in the plasma reactor, for example, the plasma reactor 100 of FIG. 2. Nitrogen gas is flown to the plasma chamber and a plasma is struck by applying RF power to a coil assembly, such as the coil assemblies 129, 131 of FIG. 2, while the nitrogen flows continuously. The plasma ionizes the nitrogen and the ionized nitrogen then diffuses into the silicon dioxide gate dielectric film.

FIG. 5A shows results from four processes of nitrogen dosage in a nitridation process when the processing gas is only supplied towards a central region of the process volume. During each process, the flow control unit 415 directs 100% of the incoming flow to the output line 414 which leads to the plurality of central injection ports 422 and all of the process gas enters the process volume 403 along directions illustrated by arrows 424. While the flow control unit 415 directs none of the incoming flow to the output line 413 that leads to the plurality of outer injection ports 421 and none of the process gas enters the process volume 403 along directions illustrated by arrows 425. The total flow rates for the four processes are 100 sccm, 300 sccm, 500 sccm, and 700 sccm respectively. The change of flow rates can be accomplished by using the flow control unit 415 also.

Results in FIG. 5A show that when the central region of the substrate has more exposure to the process gas than the edge region of the substrate when the process gas is supplied from the central injection ports only. The degree of difference between the central region and the edge region increases with the total flow rate.

FIG. 5B shows results from three processes of nitrogen dosage in a nitridation process when the processing gas is only supplied towards the edge region of the process volume. During each process, the flow control unit 415 directs none of the incoming flow to the output line 414 which leads to the plurality of central injection ports 422 and none of the process gas enters the process volume 403 along directions illustrated by arrows 424. While the flow control unit 415 directs 100% of the incoming flow to the output line 413 that leads to the plurality of outer injection ports 421 and all of the process gas enters the process volume 403 along directions illustrated by arrows 425. The total flow rates for the three processes are 100 sccm, 300 sccm, and 500 sccm respectively. The change of flow rates can also be accomplished by using the flow control unit 415.

Results in FIG. 5B show that the central region of the substrate has less exposure to the process gas than the edge region of the substrate when the process gas is supplied from the edge injection ports only. The degree of difference between the central region and the edge region increases with the total flow rate.

FIG. 5C shows results from seven processes of nitrogen dosage in a nitridation process when the processing gas is supplied towards both the edge region and the central region of the process volume. The total flow rates for the seven processes remain at 400 sccm but the ratio of the flow rate changes.

Results in FIG. 5C show the degree of gas distribution difference between the central region and the edge region may be adjustable by adjusting the ratio of flow rates for different regions.

FIGS. 5A-5C demonstrate that a desired gas distribution, for example uniform gas distribution, may be achieved by adjusting ratios of flow rates for injected gases towards different regions and the resulting ratios may be different when the total flow rate changes. Therefore, a desired gas distribution may be achieved by adjusting ratio, total flow rate, or both.

While the foregoing is directed to embodiments of the present invention, other and further embodiments of the invention may be devised without departing from the basic scope thereof, and the scope thereof is determined by the claims that follow.

What is claimed is:

1. An apparatus for processing a substrate, comprising:
a chamber body defining a process volume;
an injection nozzle assembly at least partially disposed in the process volume, wherein the injection nozzle assembly comprises a nozzle at least partially disposed in the process volume, wherein the nozzle has a substantially cylindrical body, a first plurality of injection ports formed through a bottom of the cylindrical body, and a second plurality of injection ports formed through a sidewall of the cylindrical body, wherein the first and second plurality of injection ports are open to the process volume, and the injection nozzle assembly has:
a first fluid path including a first inlet configured to receive a fluid input, and the first plurality of injection ports connected with the first inlet, wherein the first plurality of injection ports are configured to direct a fluid from the first inlet towards a first region of the process volume, and
a second fluid path including a second inlet configured to receive a fluid input, and the second plurality of injection ports connected with the second inlet, wherein the second plurality of injection ports are configured to direct a fluid from the second inlet towards a second region of the process volume; and
a flow control unit connected between a fluid source and the first and second inlets of the injection nozzle assembly, wherein the flow control unit is configured to split an incoming flow into a first output flow and a second output flow, wherein the ratio of the first output flow and the second output flow is adjustable.

2. The apparatus of claim 1, wherein the flow control unit comprises:
an inlet configured to receive the incoming flow, wherein the inlet is connected to the fluid source;
a first outlet configured to let through the first output flow; and
a second outlet configured to let through the second output flow, wherein the first outlet is connected to the first inlet of the injection nozzle assembly and the second outlet is connected to the second inlet of the injection nozzle assembly.

3. An apparatus for processing a substrate, comprising:
a chamber body defining a process volume;
an injection nozzle assembly at least partially disposed in the process volume, wherein the injection nozzle assembly comprises:
a nozzle at least partially disposed in the process volume, wherein the nozzle has a substantially cylindrical body, a first plurality of injection ports formed through a bottom of the cylindrical body, and a second plurality of injection ports formed through a sidewall of the cylindrical body, wherein the first and second plurality of injection ports are open to the process volume;
a feed plate, wherein the feed plate has a first channel and a second channel formed therein, the first channel is connected to the first inlet and the second channel is connected to the second inlet, and the nozzle coupled to the feed plate such that the first channel is in fluid communication with the first plurality of injection ports and the second channel is in fluid communication with the second plurality of injection ports;
a first fluid path including a first inlet configured to receive a fluid input, and the first plurality of injection ports connected with the first inlet, wherein the first plurality of injection ports are configured to direct a fluid from the first inlet towards a first region of the process volume; and
a second fluid path including a second inlet configured to receive a fluid input, and the second plurality of injection ports connected with the second inlet, wherein the second plurality of injection ports are configured to direct a fluid from the second inlet towards a second region of the process volume.

4. The apparatus of claim 3, wherein the nozzle is disposed in the processing volume and is fabricated from quartz.

5. A gas supply assembly for providing gas to a semiconductor processing chamber, comprising:
a feed plate having a first receiving channel and a second receiving channel formed therein, wherein the first receiving channel opens to an inner passage which is a recess formed near a center of the feed plate, and the second channel opens to an outer passage which is a circular recess surrounding the inner passage; and
a quartz cylindrical nozzle coupled to the feed plate, the nozzle having a plurality of first injection ports connected with the first receiving channel of the feed plate via a central recess of the nozzle and the inner passage of the feed plate and a second plurality of injection ports connected with the second receiving channel of the feed plate via the outer passage of the feed plate, wherein the first injection ports are formed near a center region and open to a bottom of the nozzle, and the second plurality of injection ports are formed through a cylindrical sidewall of the nozzle.

6. The gas supply assembly of claim 5, further comprising:
an upper clamp; and
a lower clamp, wherein the feed plate and the nozzle are secured together by the upper clamp and the lower clamp.

7. An apparatus for processing a substrate, comprising:
a chamber body defining a process volume;
an injection nozzle assembly at least partially disposed in the process volume, wherein the injection nozzle assembly comprises a nozzle at least partially disposed in the process volume, wherein the nozzle has a substantially cylindrical body, a first plurality of injection ports formed through a bottom of the cylindrical body, and a second plurality of injection ports formed through a sidewall of the cylindrical body, the sidewall of the cylindrical body perpendicular to the bottom of the cylindrical body, wherein the first and second plurality of injection ports are open to the process volume, and the injection nozzle assembly has:

a first fluid path including a first inlet configured to receive a fluid input, and the first plurality of injection ports connected with the first inlet, wherein the first plurality of injection ports are configured to direct a fluid from the first inlet towards a first region of the process volume, and a second fluid path including a second inlet configured to receive a fluid input, and the second plurality of injection ports connected with the second inlet, wherein the second plurality of injection ports are configured to direct a fluid from the second inlet towards a second region of the process volume; and wherein the chamber body comprises a chamber lid having an aperture formed near a center of the lid, and the nozzle is partially disposed in the processing volume through the aperture.

8. The apparatus of claim 3, further comprising:
an upper clamp; and
a lower clamp, wherein the feed plate and the nozzle are secured together by the upper clamp and the lower clamp.

* * * * *